(12) United States Patent
Juskey et al.

(10) Patent No.: US 8,030,770 B1
(45) Date of Patent: Oct. 4, 2011

(54) SUBSTRATELESS PACKAGE

(75) Inventors: Frank Juskey, Apoka, FL (US); Dean Monthei, Beaverton, OR (US)

(73) Assignee: Triquint Semiconductor, Inc., Hillsboro, OR (US)

( * ) Notice: Subject to any disclaimer, the term of this patent is extended or adjusted under 35 U.S.C. 154(b) by 244 days.

(21) Appl. No.: 12/207,206

(22) Filed: Sep. 9, 2008

(51) Int. Cl.
*H01L 23/48* (2006.01)

(52) U.S. Cl. ........ 257/738; 257/690; 257/693; 257/723; 257/724; 257/737; 257/E23.021; 257/E23.069

(58) Field of Classification Search .................. 257/723, 257/724, 737, 738, E23.021, 690, 693, E23.132, 257/772–779; 438/612–617
See application file for complete search history.

(56) References Cited

U.S. PATENT DOCUMENTS

| | | | |
|---|---|---|---|
| 6,063,646 A * | 5/2000 | Okuno et al. ................. | 438/107 |
| 6,998,710 B2 * | 2/2006 | Kobayashi et al. ........... | 257/728 |
| 7,023,085 B2 * | 4/2006 | Pu ................................. | 257/724 |
| 7,122,891 B2 * | 10/2006 | Dishongh et al. ............. | 257/700 |
| 7,183,191 B2 * | 2/2007 | Kinsman et al. ............. | 438/613 |
| 7,202,107 B2 | 4/2007 | Fuergut | |
| 7,456,496 B2 * | 11/2008 | Hwee et al. ................... | 257/691 |

OTHER PUBLICATIONS

Freescale Semiconductor, Redistributed Chip Package (RCP) Technology.
Keith Gurnett, et al., Farewell to Surface Mount, Military & Aerospace Electronics, vol. 19, No. 7, Jul. 2008.

* cited by examiner

*Primary Examiner* — Jasmine Clark
(74) *Attorney, Agent, or Firm* — Schwabe Williamson & Wyatt (57) ABSTRACT

Embodiments include but are not limited to apparatuses and systems including a microelectronic device including a die having an active surface, a conductive pillar formed on the active surface of the die, the conductive pillar having a side surface, and a molding material encasing the die and the conductive pillar, including covering the active surface of the die and the side surface of the conductive pillar. Methods for making the same also are described.

13 Claims, 7 Drawing Sheets

SUBSTRATELESS PACKAGE

TECHNICAL FIELD

Embodiments of the present invention relate generally to microelectronic devices and more particularly to devices including dies and modules packaged without carrier substrates.

BACKGROUND

In the current state of integrated circuit technology, an integrated circuit device will often be in the form of a die or a chip. One or more die sometimes will be mounted onto a carrier substrate to form a package. Although carrier substrates may be suitable for many applications, it adds to the overall size and expense of the package.

Efforts have been made to eliminate the use of carrier substrates. For example, one method is to place a die active-surface down, encapsulate the back surface of the die, turn the die active-surface up, and then, using thin film techniques to form interconnects on the active surface, interconnect the die to other components and the external world. Unfortunately, thin film techniques may be costly and complex.

BRIEF DESCRIPTION OF THE DRAWINGS

Embodiments of the present invention will be readily understood by the following detailed description in conjunction with the accompanying drawings. To facilitate this description, like reference numerals designate like structural elements. Embodiments of the invention are illustrated by way of example and not by way of limitation in the figures of the accompanying drawings.

DETAILED DESCRIPTION OF EMBODIMENTS OF THE INVENTION

In the following detailed description, reference is made to the accompanying drawings which form a part hereof wherein like numerals designate like parts throughout, and in which is shown by way of illustration embodiments in which the invention may be practiced. It is to be understood that other embodiments may be utilized and structural or logical changes may be made without departing from the scope of the present invention. Therefore, the following detailed description is not to be taken in a limiting sense, and the scope of embodiments in accordance with the present invention is defined by the appended claims and their equivalents.

Various operations may be described as multiple discrete operations in turn, in a manner that may be helpful in understanding embodiments of the present invention; however, the order of description should not be construed to imply that these operations are order dependent. Moreover, some embodiments may include more or fewer operations than may be described.

The description may use the phrases "in an embodiment," "in embodiments," "in some embodiments," or "in various embodiments," which may each refer to one or more of the same or different embodiments. Furthermore, the terms "comprising," "including," "having," and the like, as used with respect to embodiments of the present invention, are synonymous.

The term "coupled to," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

The term "formed on," along with its derivatives, may be used herein. "Formed on" in the context of a layer being "formed on" another layer may mean that a layer is formed above, but not necessarily in direct physical or electrical contact with, another layer (e.g., there may be one or more other layers interposing the layers). In some embodiments, however, "formed on" may mean that a layer is in direct physical contact with at least a portion of a top surface of another layer. Usage of terms like "top" and "bottom" are to assist in understanding, and they are not to be construed to be limiting on the disclosure.

The term "active surface" as used herein may refer to the surface of a die having the active regions/areas, as is known to those having skill in the art. The active surface a die may include any one or more of various circuitry components, such as transistors, memory cells, passive components, and the like.

For the purposes of the present invention, the phrase "A/B" means A or B. The phrase "A and/or B" means "(A), (B), or (A and B)." The phrase "at least one of A, B, and C" means "(A), (B), (C), (A and B), (A and C), (B and C), or (A, B and C)." The phrase "(A)B" means "(B) or (AB)," that is, A is an optional element.

Various embodiments of the present invention are directed to microelectronic devices including a conductive pillar formed on an active surface of a die and a molding material encasing the die and the conductive pillar, including covering the active surface of the die and the side surface of the conductive pillar. A circuit pattern may be formed on the molding material and in contact with the top surfaces of the conductive pillars for electrically contacting the die. Accordingly, in various embodiments, a substrateless package or module may be formed.

Figure 1A:
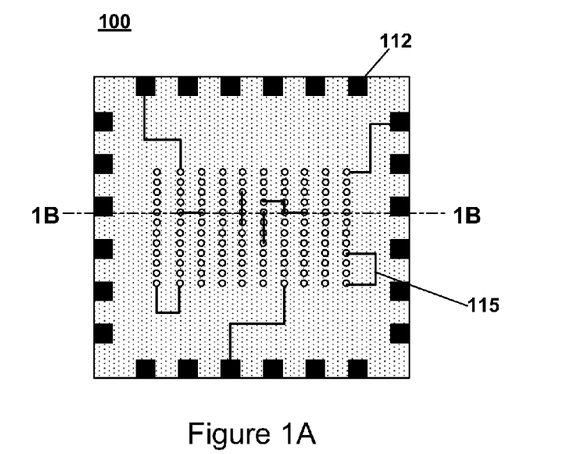
FIG. 1A illustrates a microelectronic device in accordance with various embodiments of the present invention.
Figure 1B:
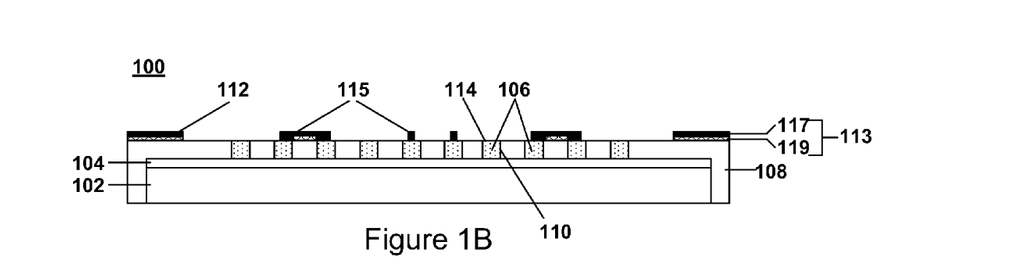
FIG. 1B illustrates a cross-sectional view of the microelectronic device of FIG. 1A taken along 1B-1B in accordance with various embodiments of the present invention.

An exemplary microelectronic device 100 is illustrated in FIG. 1A (top view) and FIG. 1B (cross-sectional view taken across dotted line 1B-1B illustrated in FIG. 1A). As illustrated, the device 100 includes at least one die 102 including an active surface 104. A plurality of conductive pillars 106 may be formed on the active surface 104, and a molding material 108 may cover the active surface 104 of the die 102 and the side surfaces 110 of the conductive pillars 106, to encase the die 102 and the conductive pillars 106, to form or begin to form a substrateless package. In alternate embodiments, the active surface 104 may run less than the entire width of die 102.

The device 100 may further include a trace layer 113, including conductive traces 115, formed on the molding material 108 for routing electrical signals or power to the die 102. For such routing, the conductive traces 115 of the trace layer 113 may be electrically coupled to one or more of the conductive pillars 106, which are then in turn electrically coupled to the active layer 104 of the die 102.

The trace layer 113 may also include pads 112. In some embodiments, the pads 112 may be plated to form a land grid array for mounting the device 100 onto a system-level board such as, for example, a printed circuit board. In some embodiments, solder bumps may be coupled to the pads 112 to form a ball grid array. The pads 112 may comprise input and/or output pads for routing signals and/or power to and from the die 102.

As illustrated, the conductive traces 115 are formed directly on the molding material 108 and directly contacting top surfaces 114 of one or more of the conductive pillars 106. In various embodiments, the conductive traces 115 may be formed using printed circuit board circuit application techniques. For example, the trace layer 113 may comprise a conductive layer 117 and a dielectric layer 119 such as, for example, a prepreg and copper film, or a resin-coated copper film including a copper layer on a dielectric material. The prepreg and copper film or resin-coated copper film may be laminated to the top surface of the molding material 108 having the conductive pillars 106 therein, the dielectric surface facing the molding material 108. The resin-coated copper film may then be etched to form the conductive traces 115 and pads 112. In some embodiments, the conductive traces 115, pads 112, and possibly the top surfaces 114 of the conductive pillars 106 may then be plated.

The conductive traces 115 may sometimes be thin-film traces formed using thin-film techniques. The thin-film traces may be formed on a suitable dielectric material including, but not limited to, a polyimide or benzocyclobutene (BCB) (or BCB-type resin). In various ones of these embodiments, the thin-film traces may be plated according to conventional printed circuit board circuit-application techniques.

In some embodiments, the device 100 may include more than one layer of conductive traces 112. The device 100 may include, for example, a plurality of layers of traces 112 stacked upon each other, and in some embodiments, electrically interconnected to each other.

In some embodiments, the conductive pillars 106 comprise copper. Other conductive material may be similarly suitable.

Molding material 108, sometimes referred to in the art as "encapsulant" or "mold compound," may be any encapsulant material known in the art suitable for the purpose. For example, a molding material may be an epoxy material. In various other embodiments, however, an encapsulant material may be one of plastic, ceramic, glass, and the like. It is noted that although material 108 is referred to as "molding material," other methods for encasing the die 102 and the conductive pillars 106 may be used. For example, the molding material 108 may be applied by molding, doctor blading, laminating, liquid dispensing (e.g., from a syringe), or other suitable technique to create an insulating layer.

Figure 2:
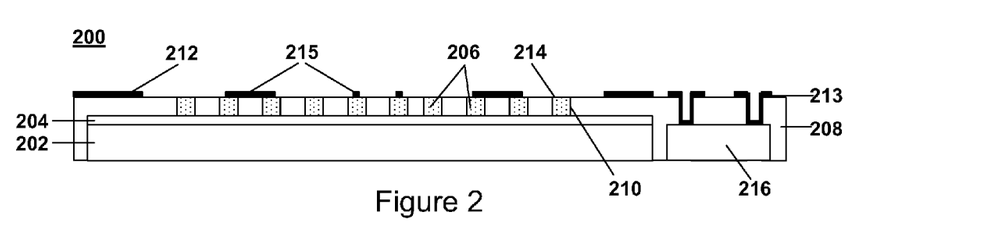
FIG. 2 illustrates another microelectronic device in accordance with various embodiments of the present invention.

FIG. 2 illustrates another exemplary microelectronic device 200 in accordance with various embodiments. As illustrated, the device 200 includes at least one die 202 and at least one other component 216. The other component 216 may be a passive device such as, for example, a resistor, an inductor, diodes, low pass filters, surface acoustic wave (SAW) or bulk acoustic wave (BAW) devices, or a capacitor. In some embodiments, the other component 216 may be another die.

Similar to the device 100 illustrated in FIG. 1A/1B, the die 202 includes an active surface 204 and a plurality of conductive pillars 206 formed thereon. A molding material 208 may cover at least the other component 216, active surface 204 of the die and the side surfaces 210 of the conductive pillars 206, to encase the other component 216, the die 102, and the conductive pillars 206. The device 200 may further include a trace layer 213, including conductive traces 215 and pads 212, formed on the molding material 208 for routing electrical signals or power to die 202.

An exemplary method for forming a microelectronic device, such as, for example, the device 100 of FIG. 1A/1B or the device 200 of FIG. 2, is illustrated in FIGS. 3A-3I by way of cross-sectional side views of the device at various stages of the method. It should be noted that various operations discussed and/or illustrated may be generally referred to as multiple discrete operations in turn, to help in understanding embodiments of the present invention. The order of description should not be construed to imply that these operations are order dependent, unless explicitly stated. Moreover, some embodiments may include more or fewer operations than may be described.

Figure 3A:
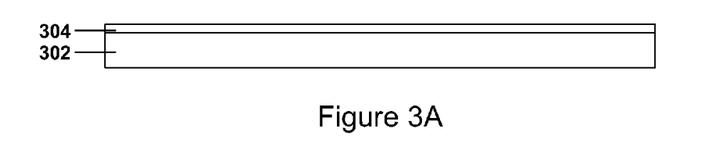
FIGS. 3A-3I illustrate various stages of a method for forming a microelectronic device structure in accordance with various embodiments of the present invention.
Figure 3B:
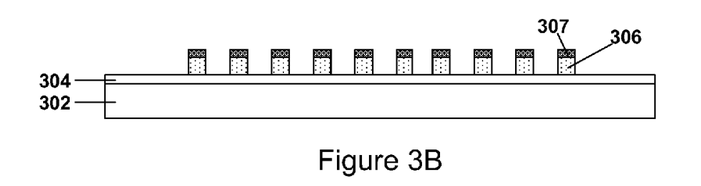

As illustrated in FIG. 3A, a die 302 including an active surface 304 is provided, and then conductive pillars 306 are formed on the active surface 304 as illustrated in FIG. 3B. As discussed herein, the conductive pillars 306 may comprise copper or another suitable material.

In some embodiments, and as illustrated, a cap layer 307 may be formed on top surfaces of the conductive pillars 306. The cap layer 307 may be removed at another stage of the method (as discussed more fully below), and thus the cap layer 307 may be a material selected to be easily removed or removed with minimal cost. In general, the cap layer 307 may serve to protect the conductive pillars 306 from exposure (e.g., to minimize oxidation or damage to the top surfaces of the conductive pillars 306). Although any material, in general, may be suitable for forming the cap layer 307, tin may be a suitable option in some embodiments. Other material may be similarly suitable.

Figure 3C:
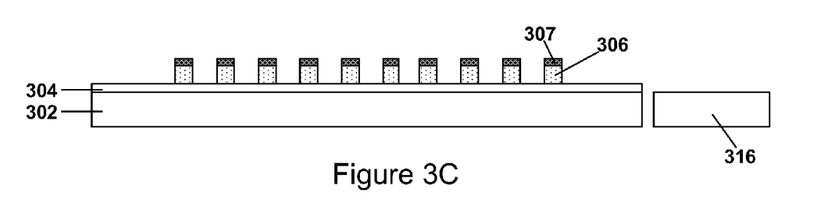

In some embodiments, at least one component 316 in addition to the die 302 may be provided, as illustrated in FIG. 3C. The other component 316 may be a passive device such as, for example, a resistor, an inductor, diodes, low pass filters, SAW or BAW devices, or a capacitor. In some embodiments, the other component 316 may be another die.

Figure 3D:
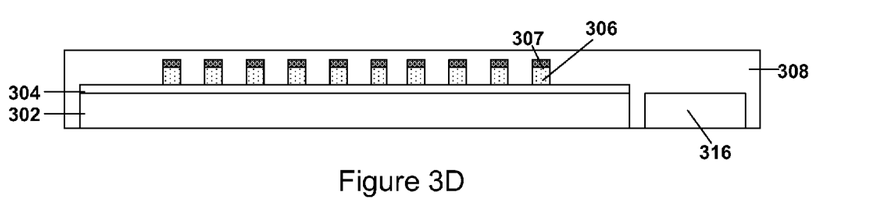

A molding material 308 may be formed over the die 302 and the other component 316, as illustrated in FIG. 3D. The molding material 308 may be formed by any method suitable for the purpose including, but not limited to, molding, doctor blading, laminating, or liquid dispensing (e.g., from a syringe). In some embodiments, the molding material 308 may be formed using a compression molding operation. Although transfer molding may be similarly suitable in many embodiments, compression molding may allow for molding across larger areas relative to that possible by transfer molding.

Figure 3E:
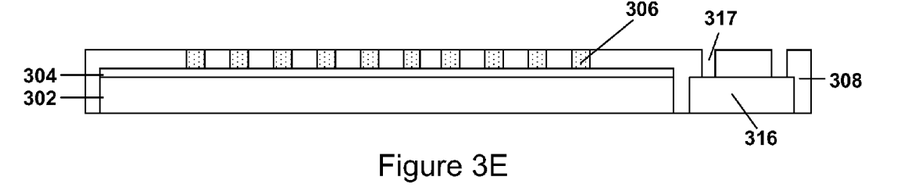

As illustrated in FIG. 3D, the molding material 308 may be formed such that conductive pillars 306 are no longer exposed. To expose the top surfaces of the conductive pillars 306, the molding material 308 may be ground down as illustrated in FIG. 3E. During the grinding operation, the cap layer 307 is removed.

During the grinding operation, it may be desirable to remove a small amount of the top surface of the conductive pillars 306 to provide a clean, even surface, but doing so is not required. In some embodiments, the molding material 308, when initially formed, may be controlled so that the conductive pillars 306 are not fully encapsulated as is done in the embodiment illustrated in FIG. 3D. In various ones of these embodiments, if the level of the molding material 308 is so controlled, use of the cap layer 307 and grinding may be eliminated if protecting the top surface of the conductive pillars 306 is not desired.

Still referring to FIG. 3E, one or more vias 317 may be formed in the molding material 308 to access the other component 316 for routing signals and/or power as needed. The vias 317 may be formed using any technique suitable for the purpose including, for example, laser drilling.

Figure 3F:
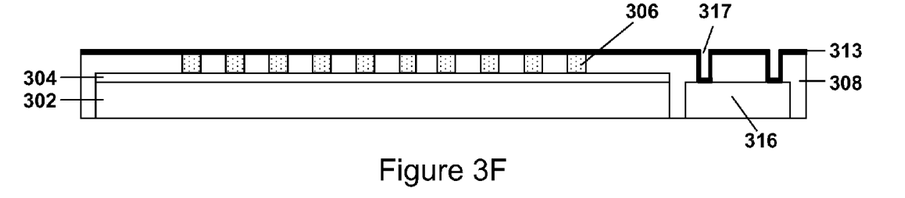
Figure 3G:
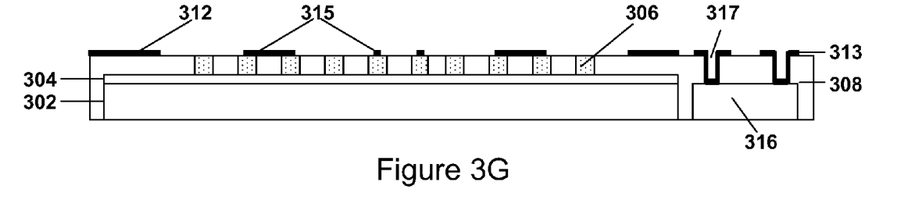

A trace layer 313 may then be formed over the molding material 308 and tops of the conductive pillars 306, as illustrated in FIG. 3F. The trace layer 313 may then be patterned and etched as illustrated in FIG. 3G, to form a pattern of conductive traces 315 and pads 312 configured to electrically interconnect with the die 302 by way of the conductive pillars 306, and with the other component 316 by way of the vias 317.

In some embodiments, the trace layer 313 may be patterned using a technique similar to that used for forming printed circuit boards. In various ones of these embodiments, the trace layer 313 may comprise a prepreg and copper film, or a resin-coated copper film including a copper layer on a dielectric material. The prepreg and copper film or resin-coated copper film may be laminated to the top surface of the molding material 308 having the conductive pillars 306 therein, the dielectric surface facing the top of the molding material 308. The prepreg and copper film or resin-coated copper film may then be etched to form the conductive traces 315.

Figure 3H:
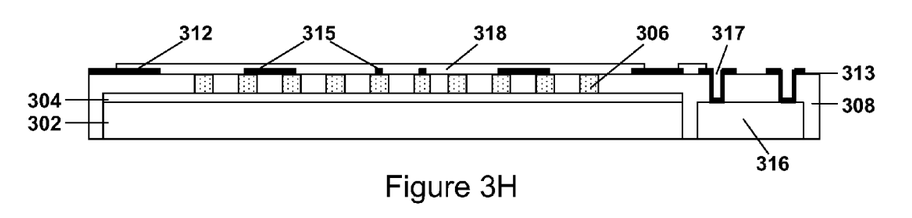

In some embodiments, a dielectric material 318 may be formed over portions of the patterned trace layer 313, the molding material 308, and the conductive pillars 306, as illustrated in FIG. 3H. Exposed portions (i.e., not covered with dielectric material 318) of the patterned trace layer 313, the molding material 308, and the conductive pillars 306 may then be plated (not illustrated). Plating may minimize oxidation of the conductive traces and may facilitate solderability.

Figure 3I:
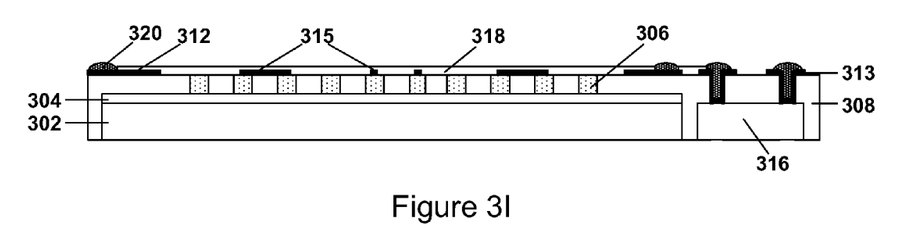

As illustrated in FIG. 3I, solder 320 may be formed on exposed portions of the patterned trace layer 313. The solder 320 may be provided for mounting the device onto another device or circuit board (e.g., a system level board).

Another exemplary method for forming a plurality of microelectronic device, such as, for example, the device 100 of FIG. 1A/1B or the device 200 of FIG. 2, is illustrated in FIGS. 4A-4E by way of top views of the devices at various stages of the method. It should be noted that various operations discussed and/or illustrated may be generally referred to as multiple discrete operations in turn, to help in understanding embodiments of the present invention. The order of description should not be construed to imply that these operations are order dependent, unless explicitly stated. Moreover, some embodiments may include more or fewer operations than may be described.

Figure 4A:
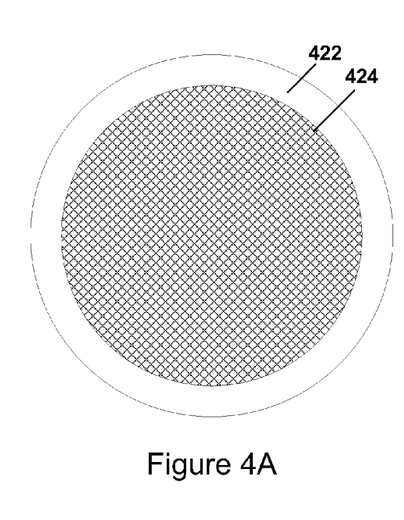
FIGS. 4A-4E illustrate various stages of another method for forming a microelectronic device structure in accordance with various embodiments of the present invention.
Figure 4B:
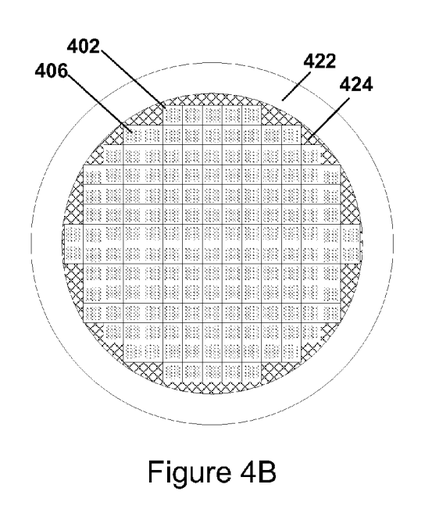

As illustrated in FIG. 4A, a substrate 422 is provided, and an adhesive 424 is adhered to the substrate 422. A plurality of dies 402, either individually or in wafer form (i.e., uncut), may then be mounted or otherwise attached onto the adhesive 424, as illustrated in FIG. 4B. The dies 402 may include conductive pillars 406, as described more fully herein.

The dies 402 may be individual dies or may be in wafer form (i.e., uncut). The substrate 422 may be any substrate suitable for supporting the plurality of dies 402 and maintaining its form during a molding operation, as will become more evident in the discussion to follow. In some embodiments, for example, the substrate 422 may be a bare printed circuit board. It is also noted that although the illustrated substrate 422 is depicted as being circular in shape, other shapes are possible within the scope of the present disclosure. For example, the substrate 422 may be oval, square, triangular, or some other polygonal shape.

The adhesive 424 may be any type of adhesive 424 capable of being adhered to on both surfaces of the adhesive 424 (e.g., a double-sided tape). In some embodiments, the adhesive 424 is capable of withstanding up to certain temperatures. During a molding operation, for example, temperatures can be expected to rise to up to 175° C. or more, and thus, the ability of adhesive 424 to withstand such temperatures may be considered. In various embodiments, the adhesive 424 may be an adhesive that loses adhesiveness, or experiences a decreased adhesiveness, at temperatures exceeding the temperatures of the molding operation. For example, an exemplary adhesive may be one that maintains adhesiveness up to about 175° C. but loses adhesiveness at about 200° C., so that the dies 402 can be removed from the adhesive 424.

Figure 4C:
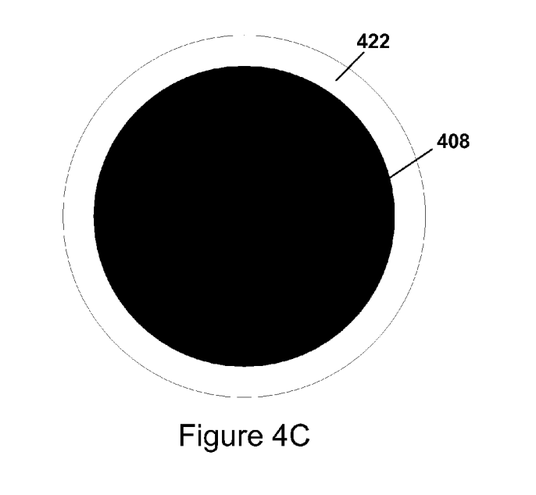
Figures 4D, 4E:
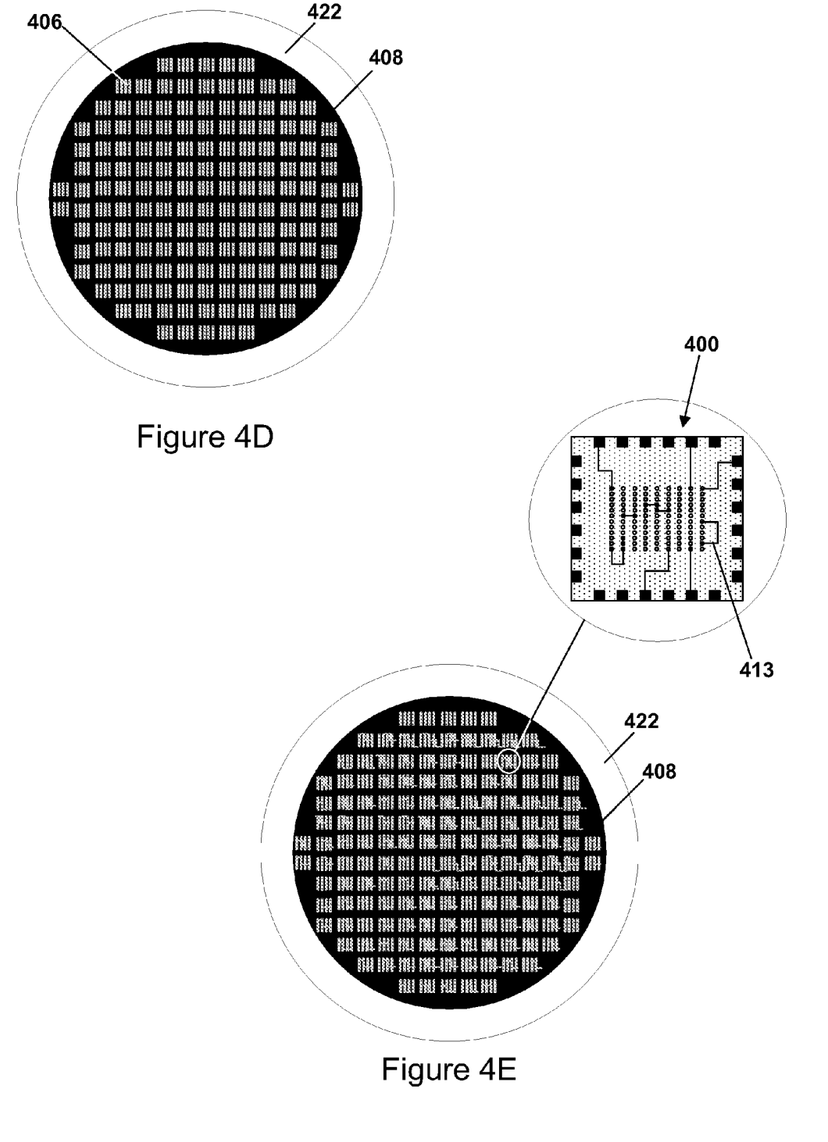

A molding material 408 may then be formed over the plurality of dies 402 (and any other components such as, e.g., passives) as illustrated in FIG. 4C. Although the molding material 408 may be formed by any method suitable for the purpose, in some embodiments compression molding may be particularly suitable. As illustrated in FIG. 4C, the molding material 408 may be formed such that conductive pillars 406 are no longer exposed. To expose the top surfaces of the conductive pillars 406, the molding material 408 may be ground down as illustrated in FIG. 4D. It is possible to control the compression molding process such that the pillar tops are not encapsulated and grinding would not be required.

A trace layer 413 may then be formed over the molding material 408 and tops of the conductive pillars 406, and patterned, as illustrated in FIG. 4E, to form conductive traces and pads. Additional trace and/or dielectric layers may be formed as desired.

Fiducial marks (not illustrated) may be provided on the substrate 422 for facilitating orientation of the substrate 422, and thus the dies 402 mounted on the substrate 422. This may facilitate the patterning of the trace layer 413.

After patterning, the devices 400 remain held together by the molding material 408. Accordingly, the molding material 408 having the devices 400 therein is removed from the adhesive 424 or otherwise detached from the substrate, and the individual devices 408 may be cut apart by a sawing operation or other suitable cutting operation.

Figure 5:
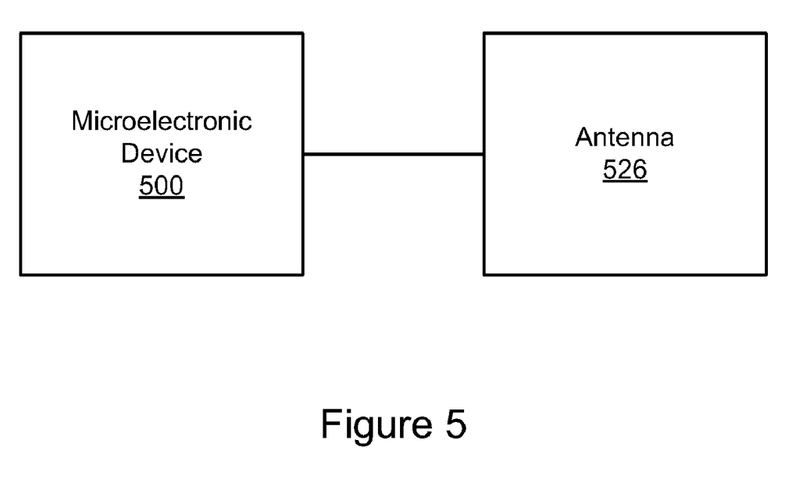
FIG. 5 illustrates a block diagram of a system incorporating a microelectronic device such as the devices illustrated in FIGS. 1A, 1B, and 2 in accordance with various embodiments of the present invention.

Embodiments of microelectronic devices described herein may be incorporated into various apparatuses and systems. A block diagram of an exemplary system is illustrated in FIG. 5. As illustrated, the system may include a microelectronic device 500 and an antenna 526. The device 500 may include, among other things, a die having a conductive pillar formed on an active surface of the die, and a molding material covering the active surface of the die and a side surface of the conductive pillar. Device 500 may be, for example, a device such as one of devices 100, 200, or 400 as illustrated in FIGS. 1A/1B, 2, and 4.

In various embodiments, the device 500 may be configured to facilitate transmission and reception of signals, and the antenna 526 may be operatively coupled, but not necessarily directly coupled, to the device 500 to transmit and receive signals.

As the device 500 may have smaller dimensions relative to various related art devices including a carrier substrate, the system may advantageously be incorporated into electronic devices, including mobile phones and other portable electronic devices. The device 500 may, in some embodiments, be modular in configuration such that it includes more than one die, one or more passive components, and possibly one or more other associated components. Although the system may be incorporated into any number of electronic devices, some suitable portable electronic devices may include a laptop computer, a personal digital assistant, a gaming device, a music player, a video player, and the like.

Although certain embodiments have been illustrated and described herein for purposes of description of the preferred embodiment, it will be appreciated by those of ordinary skill in the art that a wide variety of alternate and/or equivalent embodiments or implementations calculated to achieve the same purposes may be substituted for the embodiments shown and described without departing from the scope of the present invention. Those with skill in the art will readily appreciate that embodiments in accordance with the present invention may be implemented in a very wide variety of ways. This application is intended to cover any adaptations or variations of the embodiments discussed herein. Therefore, it is manifestly intended that embodiments in accordance with the present invention be limited only by the claims and the equivalents thereof.

What is claimed is:

1. An apparatus comprising:
    a die having an active surface;
    a conductive pillar formed on the active surface of the die, the conductive pillar having a side surface;
    a molding material encasing the die and the conductive pillar, including covering the active surface of the die and the side surface of the conductive pillar;
    a conductive trace formed on the molding material and electrically coupled to the conductive pillar and the die; and
    a dielectric material formed between the conductive trace and the molding material.

2. The apparatus of claim 1, wherein the conductive trace and the dielectric material comprise a prepreg and copper film.

3. The apparatus of claim 1, wherein the conductive trace and the dielectric material comprise a resin-coated copper film.

4. The apparatus of claim 1, wherein the conductive trace comprises a thin-film conductive trace, wherein the dielectric material comprises a polyimide or BCB type resin, and wherein the thin-film conductive trace is plated.

5. The apparatus of claim 1, wherein the conductive trace comprises a first conductive trace and wherein the apparatus further comprises a second conductive trace formed on the first conductive trace.

6. The apparatus of claim 1, wherein the conductive trace and the dielectric material comprise a resin-coated copper film.

7. The apparatus of claim 1, wherein the dielectric material and the conductive trace comprise a prepreg and copper film.

8. The apparatus of claim 1, further comprising a passive component, and wherein the molding material further covers the passive component.

9. The apparatus of claim 8, further comprising:
    a via formed through the molding material to the passive component; and
    a conductive material disposed in the via;
    wherein the conductive trace contacts the conductive material and the conductive pillar to electrically couple the die to the passive component.

10. The apparatus of claim 1, wherein the die comprises a first die and the conductive pillar comprises a first conductive pillar, wherein the apparatus further comprises a second die having a second conductive pillar formed on an active surface of the second die, and wherein the molding material further covers the second die and a side surface of the second conductive pillar.

11. A system comprising:
    a microelectronic device configured to facilitate transmission and reception of signals, the microelectronic device including:
        a die having an active surface;
        a conductive pillar formed on the active surface of the die, the conductive pillar having a side surface; and
        a molding material covering the active surface of the die and the side surface of the conductive pillar;
        a conductive trace formed on the molding material and electrically coupled to the conductive pillar and the die; and
        a dielectric material formed between the conductive trace and the molding material; and
    an antenna operatively coupled to the microelectronic device to transmit and receive the signals.

12. The system of claim 11, wherein the conductive trace is electrically coupled to the conductive pillar and the die.

13. The system of claim 11, wherein the system is a device selected from the group consisting of a mobile phone, a laptop computer, a personal digital assistant, a gaming device, a music player, and a video player.

* * * * *